United States Patent [19]
Gaw et al.

[11] Patent Number: 5,574,744
[45] Date of Patent: Nov. 12, 1996

[54] OPTICAL COUPLER

[75] Inventors: Craig A. Gaw, Scottsdale; Chan-Long Shieh, Paradise Valley; Michael S. Lebby, Apache Junction, all of Ariz.

[73] Assignee: Motorola, Schaumburg, Ill.

[21] Appl. No.: 383,151

[22] Filed: Feb. 3, 1995

[51] Int. Cl.⁶ .................................................. H01S 3/18
[52] U.S. Cl. ............................................. 372/50; 372/96
[58] Field of Search ......................... 372/50, 96; 257/81, 257/82

[56] References Cited

U.S. PATENT DOCUMENTS

| | | | |
|---|---|---|---|
| 4,581,744 | 4/1986 | Takamiya et al. | 372/50 |
| 5,475,701 | 12/1995 | Hibbs-Brenner | 372/50 |
| 5,491,712 | 2/1996 | Lin et al. | 372/50 |

FOREIGN PATENT DOCUMENTS

| | | | |
|---|---|---|---|
| 54-99586 | 8/1979 | Japan | 257/82 |
| 63-95690 | 4/1988 | Japan | 257/82 |
| 2-90576 | 3/1990 | Japan | 257/82 |
| 3-68177 | 3/1991 | Japan | 257/82 |

*Primary Examiner*—Rodney B. Bovernick
*Assistant Examiner*—Yisun Song
*Attorney, Agent, or Firm*—Gary F. Witting

[57] ABSTRACT

A substrate having a first surface and a second surface, the first surface having a vertical cavity surface emitting laser disposed therein and second surface having a photodetector integrated disposed therein, wherein the vertical cavity surface emitting laser directs a light signal toward the photodetector.

14 Claims, 2 Drawing Sheets

OPTICAL COUPLER

FIELD OF THE INVENTION

This invention relates, in general, to optical devices and, in particular, to optical couplers.

BACKGROUND OF THE INVENTION

At present, conventional optocouplers are made with a single light emitting diode (LED) and a single photodiode. Typically, the LED and the photodiode are positioned side-by-side and subsequently encased in an optical dome structure that reflects light randomly from the LED to the photodiode. With the present fabrication of conventional optocouplers, optocouplers have several problems or limitations, such as poor performance, i.e., speed, high drive current, large size, and the like.

Since conventional optocouplers having poor performance use an LED, switching speed or the speed of data transmission from the LED to the photodiode is reduced, thus lowering the performance of the optocoupler. Also, since optical coupling of the LED to the photodiode is achieved in a random fashion, optical coupling between the LED and the photodiode is not efficient, thus also lowering the performance of the conventional optocoupler.

Further, with present fabrication techniques and with a large size of the LED and the photodiode, conventional optocouplers are limited to having two LEDs and photodiodes in a single package. Because of this large size, the number of devices in one package is limited and conventional optocouplers are not suitable for high volume applications requiring high volume data transfer, as well as being not suitable for high volume manufacturing. Additionally, since size is prohibitive, conventional optocouplers can not be manufactured to couple a complete word, thus restricting conventional optocouplers to a one or two bit data transfer vehicle.

As can be seen, conventional optocouplers are not capable of present requirements, such as high manufactureability, high performance, and the like. Therefore, an optocoupler structure that is highly manufacturable and provides higher performance would be highly desirable.

DETAILED DESCRIPTION OF THE DRAWINGS

Figure 1:
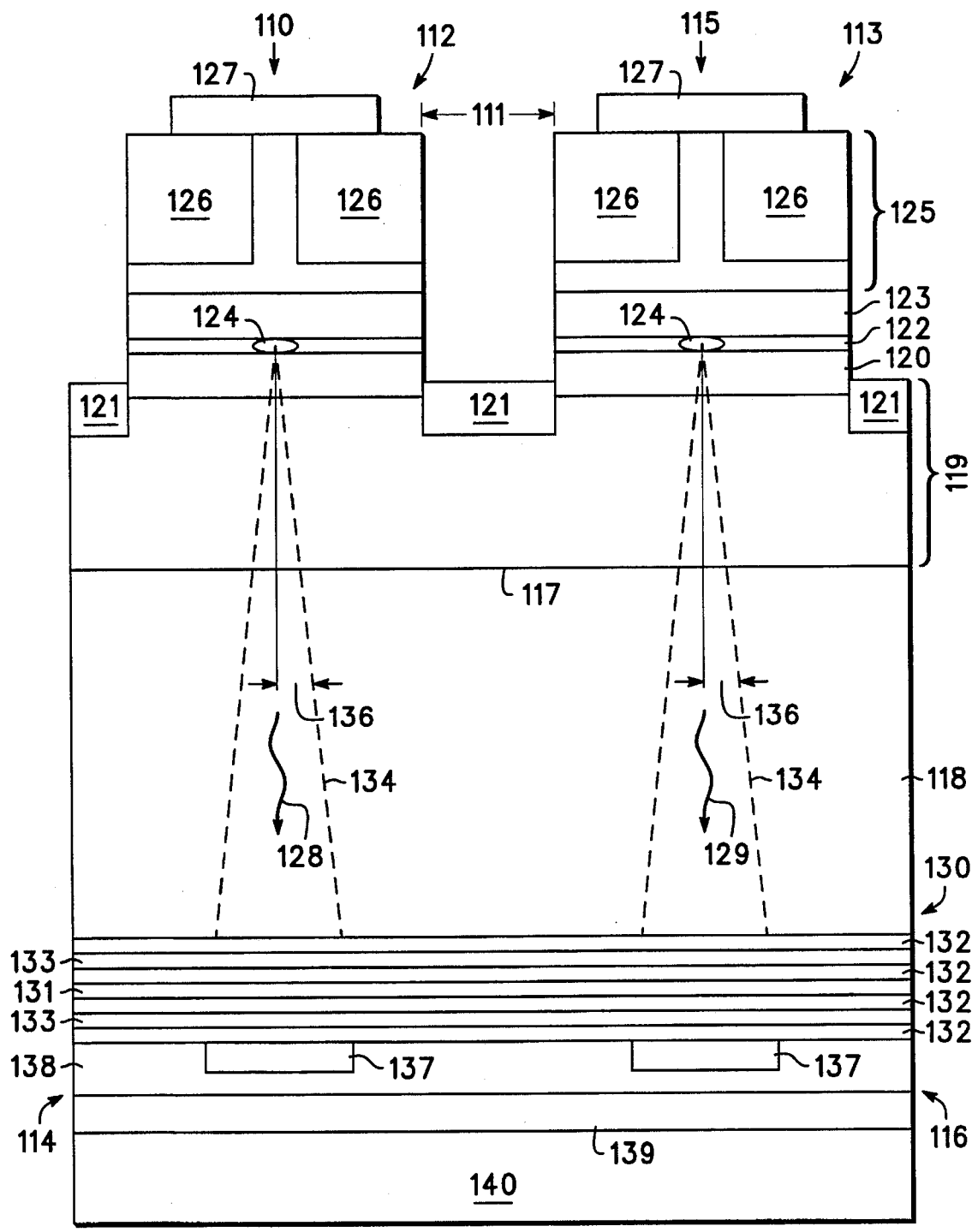
FIG. 1 is a simplified sectional view of an optocoupler embodying the present invention.

Illustrated in FIG. 1 is an example of a simplified enlarged sectional view of an optocoupler 100 having optocoupling stacks 110 and 115. Generally, optocoupling stacks 110 and 115 are made of several main elements, such as vertical cavity surface emitting lasers (VCSELs) 112 and 113, a coupling region 130, and photodetectors 114 and 116. Vertical cavity surface emitting lasers 112 and 113 are aligned with photodetectors 114 and 116. Light, represented by arrows 128 and 129, emanating from vertical cavity surface emitting lasers 112 and 113 is directed to photodetectors 114 and 116, thereby optically coupling VCSELs 112 and 113 with photodetectors 114 and 116 through coupling region 130. More specifically, vertical cavity surface emitting lasers 112 and 113 are made of several components, such as a substrate 118 having a surface 117, a stack of distributed Bragg reflectors (DBRs) 119, a cladding region 120, an active region 122 with active areas 124, a cladding region 123, a stack of distributed Bragg reflectors 125, current confinement region 126, and a contact region 127. Coupling region 130 is made of several components such as, transparent antireflective coatings or layers (ARC) 132, adhesive layers 133, and a dielectric layer 131. Photodetectors 114 and 116 are also made of several components, such as doped regions 137, an intrinsic region 138, a doped region 139, and a substrate 140.

It should be understood that vertical cavity surface emitting lasers 112 and 113 can be processed into several configurations, such as a planar vertical cavity surface emitting laser (VCSEL), a ridge-waveguide VCSEL, a buried heterostructure device, and the like, thus enabling a variety of laser and device configurations to be incorporated into optocoupler 100. Further, it should be understood that while optocoupler 100 illustrates VCSELs 112 and 113, and photodetectors 114 and 116, other VCSELs and other photodetectors can be formed, thereby providing an array of VCSELs and photodetectors. Moreover, it should be further understood that while only two optical stacks 110 and 115 are illustrated other optical stacks can be fabricated to form an array of optical stacks.

Additionally, to more particularly point out and clearly define applicants' present invention it will be assumed that VCSELs 112 and 113 and photodetectors 114 and 116 are designed to operate at wavelengths ranging from 9,000 to 11,000 Angstroms, with preferred range from 9,400 to 9,600 Angstroms, and a nominal wavelength of 9,500 Angstroms. However, it should be understood by one of ordinary skill in the art that VCSELs 112 and 113 and photodetectors 114 and 116 can be designed to operate at any suitable wavelength, by changing some specific parameters, such as compositions, thicknesses, and a layers that are given hereinafter.

Generally, substrate 118 having surface 117 is made of any suitable semiconductor material, such as gallium arsenide, indium phosphide, or the like that are either n-doped, p-doped, or undoped. However, in a preferred embodiment of the present invention, substrate 118 is made of n-doped gallium arsenide, thereby facilitating epitaxial growth of the stack of DBRs 119 on substrate 118. Further, it should be understood that substrate 118 can be selected or designed so that light 134 is able to pass through substrate 118 and coupling region 130 to respective photodetectors 114 and 116. Thus, substrate 118 and coupling region 130 are transparent to a wavelength of light emitted from VCSELs 112 and 113.

Deposition or growth of the stacks of DBRs 119 and 125, cladding regions 120 and 123, active region 122, and portions of contact region 127 is achieved by any suitable method, such as Metal Organic Chemical Vapor Deposition (MOCVD), Molecular Beam Epitaxy (MBE), Chemical Beam Epitaxy (CBE), sputtering, evaporation, or the like.

The stack of DBRs 119 is disposed or deposited on substrate 118 with a first dopant type having a first dopant concentration. The stack of DBRs 119 is made of alternating films or layers of aluminum gallium arsenide having an aluminum concentration that alternates from a first concentration to a second concentration. Doping of the stack of DBRs 119 is achieved by any suitable n-type dopant, such as silicon (Si), selenium (Se), or the like. Further, in some applications, a continuous grading layer is interspersed between the alternating layers of the stack of DBRs 119 and 125, thereby lowering a serial resistance of VCSELs 112 and 113. As a result of lowering the serial resistance, a threshold voltage is correspondingly lowered, thereby increasing performance of VCSELs 112 and 113.

Generally, aluminum concentrations of the alternating layers alternate between 15 and 80 percent nominally, with these concentration values ranging from 75 to 100 and from 0 to 20 percent, with a preferred range from 78 to 82 and from 13 to 17 percent, respectively. Typical doping concentrations for the stack of DBRs 119 can range from 5E17 to 5E18 per centimeter cubed ($cm^{-3}$), with a preferable range from 5E17 to 2E18 per centimeter cubed ($cm^{-3}$), and a nominal value 1E18 per centimeter cubed ($cm^{-3}$).

Generally, thicknesses of alternating layers are adjusted to a quarter wavelength (¼) of the desired wavelength at which VCSELs, i.e., VCSELs 112 and 113, are designed to operated at. Additionally, while any suitable number of alternating layers or pairs is used for fabricating VCSELs 112 and 113. It should be understood that, in general, increasing of the number of alternating layers improves performance of VCSELs 112 and 113. Also, it should be further understood that the pairs or number of alternating layers is dependent upon where light 134 is emitted from. For example, with reference to FIG. 2, with light 134 being emitted toward emission holes 201 and 202, the stack of DBRs 119 has an increased number of pairs or alternating layers relative to the stack of DBRs 125.

Cladding region 120 includes a layer of n-doped aluminum gallium arsenide and a layer of undoped aluminum gallium arsenide deposited on the stack of DBRs 119, wherein the layer of n-doped aluminum gallium arsenide is deposited on the stack of DBRs 119 and wherein the layer of undoped aluminum gallium arsenide is deposited on the layer of n-doped aluminum gallium arsenide. Typically, the layer of n-doped aluminum gallium arsenide is doped with a similar concentration and ranges as previously described for the stack of DBRs 119. However, an aluminum composition of the layer of n-doped aluminum gallium arsenide can range from 40 to 60 percent, with a preferred range from 45 to 55 percent, and a nominal value of 50 percent. Additionally, thicknesses of the layer of n-doped aluminum arsenide and the layer of undoped aluminum gallium arsenide are on the order of 400 and 600 Angstroms, respectively. Also, the layer of undoped aluminum gallium arsenide typically has an aluminum composition that ranges from 10 to 50 percent, with a preferable range from 20 to 40 percent, and a nominal value of 30 percent.

Figure 2:
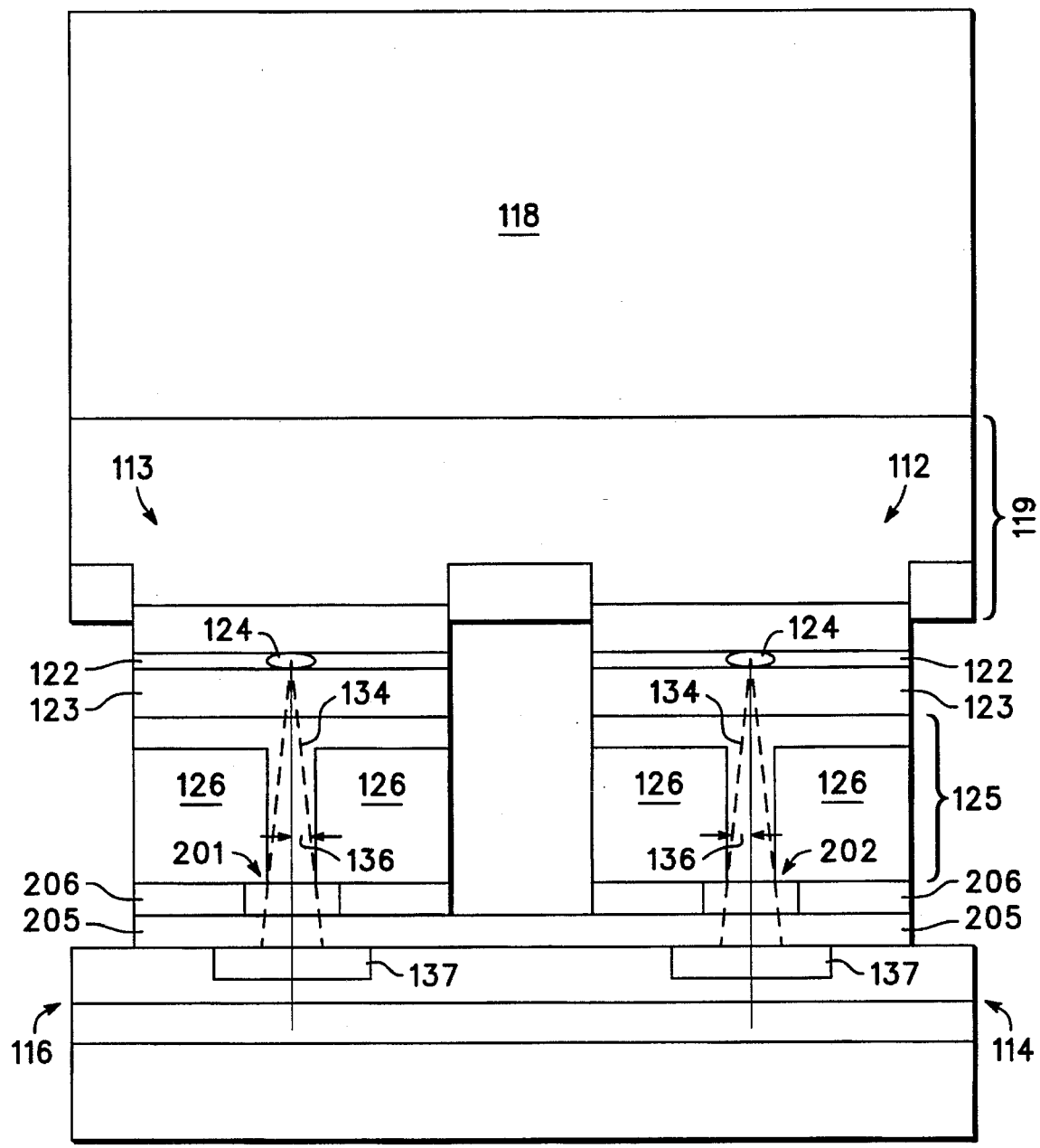
FIG. 2 is another simplified sectional view of an optocoupler embodying the present invention.

Active region 122 is deposited or disposed on cladding region 120 as previously described. Active region 122 is made to include at least a quantum well and two barrier regions, wherein the quantum well is positioned between the two barrier regions. However, it should be understood that any suitable number of quantum wells and barrier region can be used in VCSELs 112 and 113. Barrier regions are made of undoped aluminum gallium arsenide with an aluminum composition being any suitable value. Typically, the aluminum composition for the barrier region ranges from 10 to 50 percent, with a preferable range from 20 to 40 percent, and a nominal value of 30 percent. The quantum well is made of any suitable material, such as undoped indium gallium arsenide, or the like. However, it should be understood that material composition of the quantum well can be changed to gallium arsenide for other configurations such as shown in FIG. 2, as well as other suitable semiconductor compositions. Generally, both the barrier regions and the quantum well have thicknesses on the order of 100 Angstroms.

Cladding region 123 includes a layer of p-doped aluminum gallium arsenide and a layer of undoped aluminum gallium arsenide deposited on active region 122, wherein the undoped aluminum gallium arsenide is deposited on active region 122, and wherein the layer of p-doped aluminum gallium arsenide is deposited on the layer of undoped aluminum gallium arsenide. Aluminum composition of the layer of p-doped aluminum gallium arsenide can range from 40 to 60 percent, with a preferred range from 45 to 55 percent, and a nominal value of 50. Thicknesses of the layer of p-doped aluminum gallium arsenide and the undoped aluminum gallium arsenide are on the order of 400 and 600 Angstroms, respectively. The layer of undoped aluminum gallium arsenide typically has an aluminum composition that ranges from 10 to 50 percent, with a preferable range from 20 to 40 percent, and a nominal value of 30 percent.

The layer of p-doped aluminum gallium arsenide, the stack of DBRs 125, and contact region 127 are made of aluminum gallium arsenide doped with any suitable p-type dopant, such as carbon, beryllium, zinc, or the like. Generally, the doping concentrations of the layer of p-doped aluminum gallium arsenide and the stack of DBRs 125 range from 5E17 to 1E19 per centimeter cubed ($cm^{-3}$), with a preferred range from 5E17 to 4E18 per centimeter cubed ($cm^{-3}$) and with a nominal value of 1E18 per centimeter cubed ($cm^{-3}$). However, regarding contact region 127, in a preferred embodiment of the present invention, contact region 127 is doped with a p-type dopant such as zinc, or the like having doping concentrations that range form 1E18 to 5E19 per centimeter cubed ($cm^{-3}$) with a nominal value of 2E19 per centimeter cubed ($cm^{-3}$).

The stack of DBRs 125 includes alternating layers made of aluminum gallium arsenide, wherein the aluminum composition of the alternating layers alternates as previously described for the stack of DBRs 119. Moreover, as previously stated with reference to the stack of DBRs 119, thicknesses of the alternating layers are generally configured to be one quarter wavelength.

Current confinement regions 126 are made by locally changing the crystal structural integrity of portions of the stack of DBRs 125, generating local areas of increased electrical resistance. By generating local areas of increased electrical resistance, current is directed to active areas 124 of active region 122, during operation of VCSELs 112 and 113, thereby producing light 128 and 129. Generally, the change in structural integrity of the stack of DBRs 125 is achieved by implanting any suitable ion, such as hydrogen, oxygen, or the like, thus changing the epitaxial structure at the implanted area and increasing its local resistance. Additionally, it should be understood that other methods can be used to generate current confinement regions 126 such as etching, thereby fabricating a ridge waveguide structure.

Contact regions 121 are made of any suitable conductive material, such as a metal, e.g., titanium, tungsten, aluminum, or the like, an alloy, e.g., titanium-tungsten, or the like. Fabrication of contact regions 121 is achieved by any suitable fabrication method or combination or methods, such as deposition, photolithography, etching, or the like. Typically, applying a voltage between contact 121 and contact region 127 results in VCSELs 112 and 113 to producing light 128 and 129.

Coupling region 130 is made of several layers, such as antireflective layers 132, adhesive layers 133, and dielectric layer 131. Generally, antireflective layers 132 are made to prevent reflection of light 128 and 129 back to VCSELs 112 and 113, thereby providing a more efficient passage of light 128 and 129 through coupling region 130 and to photodetectors 114 and 116. Antireflective layers 132 are made of any suitable material, such as nitride, oxynitride, or silicon dioxide, or the like that has been adjusted to provide antireflection qualities while allowing light 128 and 129 to pass through antireflective layers 132. Typically, this is achieved by selecting a thickness of antireflective layers 132 in accordance to Snells Law.

Antireflective layers 132 are fabricated by any suitable deposition method, such as chemical vapor deposition (CVD), e.g., low pressure chemical vapor deposition (LPCVD), plasma enhanced chemical vapor deposition (PECVD), high pressure chemical vapor deposition (HPCVD), sputtering, or the like.

Dielectric layer 131 provides electrical isolation between VCSELs 112 and 113 and photodetectors 114 and 116. Dielectric layer 131 is made of any suitable nonconductive material, such as nitride, oxynitride, silicon dioxide, plastics, e.g., polyimides, epoxies, or the like. With regard to nitride, oxynitride, and silicon dioxide, these materials are deposited as described hereinabove. However, plastic materials are fabricated and applied by any suitable method, such as spinning-on, laminating, or the like.

Adhesive layers 133 are optically transparent, thereby allowing light 128 and 129 to pass through adhesive layers 133 while still having adhesive qualities. Adhesive layers 133 generally affix VCSELs 1! 2, 113 to photodetectors 114, 116 by adhesive layers of coupling region 130. Adhesive layers 133 are made of any suitable adhesive material, such as plastic, e.g., polyimides, epoxies, or the like and are applied by any suitable method, such as spinning, laminating, or the like.

It should be understood that coupling region 130 can be further simplified in some applications. For example, with dielectric layer 131 being a plastic adhesive, the dielectric, the antireflective, and the adhesive qualities are combined into a single layer. However, it will be understood by one of ordinary skill in the art that careful consideration of the application requirements is necessary for such combination.

Photodetectors 114 and 116 are aligned to VCSELs 112 and 113 for capturing light 128 and 129 from VCSELs 112 and 113, respectively. Generally, photodetectors 114 and 116 are made by any suitable method or combination of methods, such as photolithography, etching, epitaxial deposition, ion implantation, or the like that makes either a p-i-n photodiodes or n-i-p photodiodes having a p-n junction with an impurity doping profile tailored so that a portion of intrinsic region 138 is between doped region 137 and doped region 139.

Substrate 140 is made of any suitable material, such as silicon, gallium arsenide, indium phosphide or the like. While it should be understood that many different substrates can be used, for the sake of illustration, substrate 140 is assumed to be silicon unless otherwise specified.

Doped region 139 is made of any suitable material having an appropriate doping concentration. For example, with substrate 140 being silicon, the doped region 139 is made by epitaxially depositing silicon doped with an n-type dopant, such as phosphorus or the like, thereby providing an n-doped layer for photodetectors 114 and 116.

Intrinsic region 138 is made of any suitable undoped material. For example, with substrate 140 being silicon, with doped region 139 being made of n-doped silicon, intrinsic region 138 is made by epitaxially depositing undoped silicon on doped region 139, thereby providing intrinsic region 138.

Doped region 137 is made of any suitable material having an appropriate doping concentration. For example, with substrate 140 having the structure described above, intrinsic layer 138 is masked to provide a portion that is exposed while other portions are covered. The exposed portion is then doped with a p-type dopant, such as boron or the like, thereby generating a p-type doped region. Thus, making a p-i-n photodiode illustrated as photodetectors 114 and 116.

Illustrated in FIG. 2 is another example of an enlarged simplified sectional view of an optocoupler 200 having optical stacks 110 and 115. It should be understood that similar features and elements previously described will retain their original identifying numerals.

Generally, VCSELs 112 and 113 have been modified to emit light 128 and 129 through emission holes 201 and 202 to photodetectors 114 and 116, respectively. Further, isolation layer 205 is positioned between VCSELs 112, 113 and photodetectors 114 and 116, thereby providing electrical isolation that prevents electrical coupling of VCSELs 112, 113 and photodetectors 114, 116.

Contact region 206 is made by any suitable method or technique to provide a means for light 128 and 129 to be able to pass through contact region 206, as well as to provide an electrical contact for VCSELs 112, 113. For example, contact region 206 can be made as previously described with an additional layer of an electrically conductive and optically transparent material such as indium titanium oxide. In yet another example, contact region 206, is made as previously described with an additional layer of an electrically conductive metal, e.g., gold, silver, or the like, that is additionally processed to provide emission holes 201 and 202. Generally, emission holes 201 and 202 are fabricated by photolithography and etching process.

Isolation layer 205 is made of any suitable optically transparent dielectric material, such as silicon dioxide, oxynitride, nitride, sapphire, diamond, and plastics, e.g., polyimides, or the like. Isolation layer 205 can be further modified to provide additional isolation by any suitable method, such as increasing a thickness of isolation layer 205, selecting a material having a higher dielectric strength, or the like. Further, isolation layer 205 can be designed to separate VCSELs 112 and 113 from photodetectors 114 and 116 from isolation layer 205, thereby providing an isolation gap on each side of isolation layer 205. These isolation gaps can be either be filled with any suitable optically transparent dielectric material such as polyimide, or not filled at all. Additionally, by patterning each side of isolation layer 205 with an electrically conductive material, isolation layer 205 can be used to electrically bring out the electrical connections to contacts such as bonding pads for the VCSELs 112, 113 and photodetectors 114, 116.

As illustrated in FIGS. 1 and 2, light 128 and 129 is directed in a narrow beam, illustrated by dotted lines 134, from VCSELs 112 and 113 to photodetectors 114 and 116. Light 128 and 129 is generated from VCSELs 112 and 113 having a half angle of approximately 5.0 degrees which is illustrated by arrows 136. VCSELs 112 and 113 and photodetectors 114 and 116 are arranged in close proximity to each other, thereby allowing arrays, described hereinbelow, to be fabricated in a small package size. For example, optical stacks 110 and 115 can have a distance 111 ranging from 1.5 microns and larger, with preferred range from 200.0 microns to 300.0 microns, and a nominal distance of 250.0 microns, thereby enabling an array of optical stacks to be formed. Additionally, since VCSELs 112 and 113 and since photodetectors 114 and 116 can be manufactured on single substrates 118 and 140, respectively, high volume manufacturing with a low cost is provided. Further, since half angle 136 is less than 5.0 degrees, cross-talk between optical stacks 110 and 115 is either eliminated or greatly reduced.

Further, while optocouplers 100 and 200 are explained hereinabove as including two substrates, it should be understood that in some applications optocouplers 100 and 200 can be further simplified to be fabricated on a single substrate.

Figure 3:
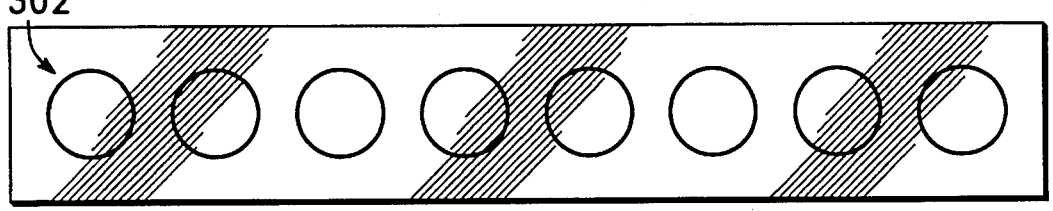
FIGS. 3 and 4 are plan diagrammatic views of layouts for optical stacks.
Figure 4:
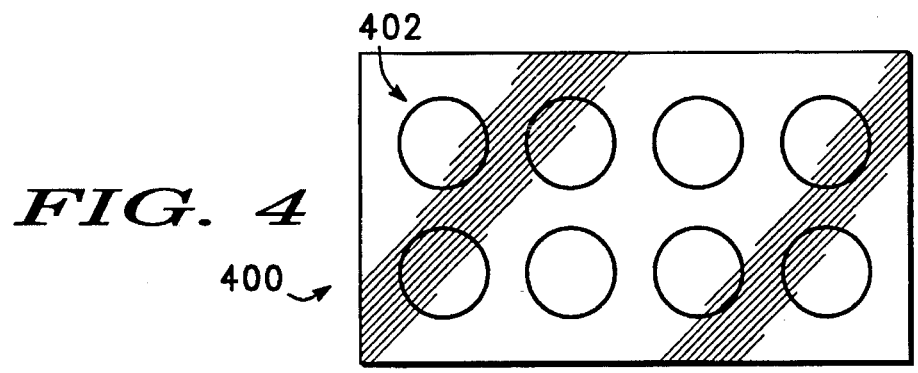

FIGS. 3 and 4 are enlarged simplified plan diagrammatic views of layouts for positioning a plurality of optical stacks 302 and 402 in arrays 300 and 400, respectively. The plurality of optical stacks 302 and 402 are similar to optical stacks 110 and 115 described hereinabove (see FIGS. 1 and 2).

Referring now more specifically to FIG. 3, array 300 illustrates a single row of the plurality of optical stacks 302, i.e., a one by eight (1×8) row, that makes a complete word having eight bits. Thus, by using the complete row to send and receive, complete words are sent at one time, thereby improving performance of optocouplers 100 and 200. Additionally, it should be understood that word sizes change from time to time, e.g., eight, sixteen, and thirty-two bit words are used presently, thus by increasing the plurality of optical stacks in arrays 300 and 400 larger words can be used.

Referring now to FIG. 4, array 400, illustrates a two by four array, i.e., two rows and four columns (2×4), thereby making a complete eight bit word. By designing array 400 as a two by four array, an economy of size is gained, thus enabling large word sizes to be handled in a relatively small size. It should be understood that other arrangements of rows and columns are capable of being fabricated, thereby enabling a variety of optocouplers to be fabricated.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

By now it should be appreciated that a novel optocoupler and method for making some has be described. Further, since VCSELs have superior light confinement, optocouplers with a plurality of optical stacks are highly manufactureable in a cost effective manner with higher performance.

What is claimed is:

1. An optocoupler comprising:
   a first substrate having a first surface and a second surface, the first substrate having a ridge waveguide vertical cavity surface emitting laser formed thereon so as to emit a beam of light through the second surface of the first substrate; and
   a second substrate having a first surface and a second surface, the second substrate having a photodetector formed thereon so as to receive light directed toward the first surface of the second substrate, the first surface of the second substrate being optically and physically coupled to the second surface of the first substrate to operably couple the vertical cavity surface emitting laser with the photodetector.

2. An optocoupler as claimed in claim 1 wherein the first substrate is gallium arsenide.

3. An optocoupler as claimed in claim 1 wherein the first substrate is indium phosphide.

4. An optocoupler as claimed in claim 1 further including an anti-reflection layer positioned between the second surface of the first substrate and the first surface of the second substrate, thereby damping internal reflections.

5. An optocoupler as claimed in claim 1 further including a dielectric layer positioned between the second surface of the first substrate and the first surface of the second substrate, thereby isolating the first substrate from the second substrate.

6. A method for making an optocoupler comprising the steps of:
   providing a first substrate having first and second surfaces and a second substrate having first and second surfaces:
   forming a ridge waveguide vertical cavity surface emitting laser in the first substrate including,
   growing a first mirror stack on the first surface of the first substrate.
   growing a first cladding layer on the first mirror stack;
   an active layer on the first cladding layer; a second layer on the active layer;
   growing a second mirror stack on the second cladding layer,
   etching at least the second mirror stack to form a mesa or ridge, and
   further forming the vertical cavity surface
   emitting laser with a light output directed toward the second surface of the first substrate; and
   forming a photodetector in the second substrate with a light receiving input directed toward the first surface of the second substrate; and
   disposing the photodetector on the second surface of the first substrate and optically aligning the light receiving input of the photodetector and the light output of the vertical cavity surface emitting laser to be operably coupled.

7. A method for making an optocoupler as claimed in claim 6 wherein the step of disposing further includes forming a coupling region, the coupling region being located between the photodetector and the first surface of the second substrate.

8. A method for making an optocoupler as claimed in claim 7 where, in the step of forming a coupling region, the coupling region includes an antireflection layer.

9. A method for making an optocoupler as claimed in claim 7 where, in the step of forming a coupling region, the coupling region is a dielectric material.

10. An optocoupler comprising:
    a first substrate having a first surface and a second surface, the first substrate having a first ridge waveguide vertical cavity surface emitting laser and a second ridge waveguide vertical cavity surface emitting laser integrated therein, the first and second ridge waveguide vertical cavity surface emitting lasers being spaced apart a distance with a range from 1.5 microns and greater, the first ridge waveguide vertical cavity surface emitting laser and the second ridge waveguide vertical cavity surface emitting laser each having a light output directed toward the second surface of the first substrate; and
    a second substrate having a first surface and a second surface, the second substrate having a first photodetector and a second photodetector formed thereon each having a light receiving input, spaced apart from each other and directed toward the first surface of the second substrate: and
    the first surface of the second substrate being optically and physically coupled to the second surface of the first substrate, the first and second photodetectors being operably coupled to the first and second ridge waveguide vertical cavity surface emitting lasers, respectively.

11. An optocoupler as claimed in claim 10 wherein the first substrate is gallium arsenide.

12. An optocoupler as claimed in claim 10 wherein the first substrate is indium phosphide.

13. An optocoupler as claimed in claim 10 further including an anti-reflection layer positioned between the second surface of the first substrate and the first surface of the second substrate, thereby damping internal reflections.

14. An optocoupler as claimed in claim 10 further including a dielectric layer positioned between the second surface of the first substrate and the first surface of the second substrate, thereby isolating the first substrate from the second substrate.

* * * * *